US006989298B2

(12) United States Patent
Chen et al.

(10) Patent No.: US 6,989,298 B2
(45) Date of Patent: Jan. 24, 2006

(54) METHOD OF FORMING THIN-FILM TRANSISTOR DEVICES WITH ELECTRO-STATIC DISCHARGE PROTECTION

(75) Inventors: Chen-Ming Chen, Taichung (TW); Fang-Tsun Chu, Ta Li (TW); Jiun-Jye Chang, Hsinchu (TW)

(73) Assignee: Industrial Technology Research Institute, (TW)

( * ) Notice: Subject to any disclaimer, the term of this patent is extended or adjusted under 35 U.S.C. 154(b) by 69 days.

(21) Appl. No.: 10/794,219

(22) Filed: Mar. 4, 2004

(65) Prior Publication Data

US 2005/0151194 A1    Jul. 14, 2005

(30) Foreign Application Priority Data

Jan. 13, 2004   (TW)   .............................. 93100834 A (51) Int. Cl.
*H01L 21/00*   (2006.01)
*H01L 21/84*   (2006.01)
(52) U.S. Cl. ...................... 438/151; 438/149; 438/157; 438/238
(58) Field of Classification Search ................ 438/149, 438/151, 157, 238
See application file for complete search history.

(56)     References Cited

*Primary Examiner*—Long Pham
(74) *Attorney, Agent, or Firm*—Michael A. Glenn; Glenn Patent Group (57)      ABSTRACT

A silicon layer is formed on a substrate, and then the silicon layer is patterned, and source regions, drain regions and connectors, all with the same conductivity, are formed. The source regions are connected with the drain regions electrically by the connectors, and short circuits are thus constructed. Then, subsequent procedures of thin film transistor fabrication are performed in turn. Finally, when the source/drain metal is patterned to form data lines, the connectors are cut off by etching as the source/drain metal is etched.

13 Claims, 8 Drawing Sheets

METHOD OF FORMING THIN-FILM TRANSISTOR DEVICES WITH ELECTRO-STATIC DISCHARGE PROTECTION

FIELD OF THE INVENTION

The present invention relates to a method of forming thin-film transistor devices, and more particularly, to a method of forming thin-film transistor display devices with electro-static discharge protection.

BACKGROUND OF THE INVENTION

Thin film transistor (TFT) has been employed for driving an active matrix liquid crystal display (AMLCD) generally, but accumulation of static electricity is usually produced in fabricating thin film transistors because a glass substrate used for display is an insulator, and electro-static accumulation issues easily result in device damage and greatly reduce product yield.

Static electricity is usually generated from the process environment in thin film transistor fabrication, such as in the chemical vapor phase deposition (CVD), sputtering or plasma dry etching process. In addition, static electricity accumulation is also produced from outside conditions in process transition or substrate transmission. Static electricity accumulation cannot be cancelled by the insulating glass substrate, and an apparent potential difference is therefore induced between devices and conductors on the substrate. Once electro-static discharge (ESD) occurs, a transient high current and a transient high voltage are produced and lead to lower reliability and even perpetual damage in devices or circuits.

For ESD issues, a method of decreasing or removing static electricity sources is generally used to reduce probability of static electricity production, but static electricity production is merely restricted by controlling static electricity sources, and static electricity production cannot be completely avoided completely. If static electricity accumulates, ESD issues are still not resolved in practice. Another method of changing the driver circuit design in devices is thus utilized for resolving ESD issues, and circuit design with ESD protection is used to disperse static electricity accumulation in devices and reduce potential differences resulting from static electricity accumulation. ESD occurrence is thus eliminated greatly, and device protection is also achieved.

General circuit design with ESD protection suited to flat panel display comprises resistors type, shorting-ring type, shorting-bar type or metal lines increase. But there are drawbacks of resolution loss and aperture ratio reduction in the circuit design types aforementioned, and shorting-rings or shorting-bars are thus located in peripheral circuit regions in panels to prevent display region from being affected. However, static electricity released by peripheral shorting-ring or shorting-bar design is limited, and more particularly, ESD in a TFT or a pixel is particularly unavoidable.

SUMMARY OF THE INVENTION

An objective of the present invention is to provide a method of forming thin film transistor (TFT) devices with electro-static discharge (ESD) protection, which method can be applied in liquid crystal display device fabrication. Additionally, the present invention provides a method for dispersing static electricity accumulation, keeping the surface smoothness of a passivation layer in display device fabrication, and maintaining the product quality of display devices.

A source region is connected with a drain region in a silicon layer to form a short circuit, and the electro-static accumulation produced in the TFT manufacturing processes is thus dispersed by the short circuit, and ESD damage is then reduced greatly. In a final process of TFT manufacture, the connection between the source region and the drain region is cut off to recover the electrical property of TFT devices.

According to the aforementioned objectives of the present invention, a method of forming TFT devices with ESD protection is provided. According to one preferred embodiment of this invention, a silicon layer is formed on a substrate, and the silicon layer is implanted with ions and patterned to form source regions, drain regions, channel regions and connectors. The source regions are connected electrically with the drain regions by the connectors to construct short circuits, and the silicon layer may be a poly-crystalline silicon (poly-Si) layer. Next, a gate-oxide layer, gate electrodes and a dielectric interlayer are formed in turn, and contact holes and openings exposing the connectors are formed in the dielectric layer.

Finally, a source/drain (S/D) metal layer is formed, and the S/D metal layer is patterned to form data lines and the silicon layer in the openings is also removed by etching the S/D metal layer simultaneously. Therefore, the connectors linking the source regions and the drain regions are all cut, and the short circuits are thus canceled to recover the electrical property of TFT devices when the TFT devices are formed.

After forming the TFT devices, a passivation layer with a smoothening function is formed, and subsequent processes of display devices fabrication are then performed to form the display devices. Because the short circuits are cut off when the S/D metal layer is etched to form the data lines, the smoothness of the passivation layer is not affected, and an area occupied by pixel electrodes is not decreased to maintain the aperture ratio of products.

With the application of the present invention, TFT devices with ESD protection are formed to improve the product yields and device reliability, and short circuits for dispersing static electricity accumulated are formed with the silicon layer fabrication to prevent effectively ESD damage in procedures of TFT manufacture.

In addition, the smoothness of the passivation layer and subsequent processes of display device fabrication are all unaffected by employing the present invention, the procedures of TFT fabrication are not increased, and product quality of display devices is also maintained.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention utilizes short circuits inside a thin film transistor or between two thin film transistors to disperse static electricity accumulation. Source regions are connected with drain regions by pattern design of a poly-crystalline silicon (poly-Si) layer to construct short circuits in thin film transistor (TFT) devices, and static electricity accumulation produced in processes of TFT fabrication is thus dispersed. Then, the short circuits are cut off in a final process of TFT fabrication to finish the TFT devices with electro-static discharge (ESD) protection.

Embodiment 1

Figure 1:
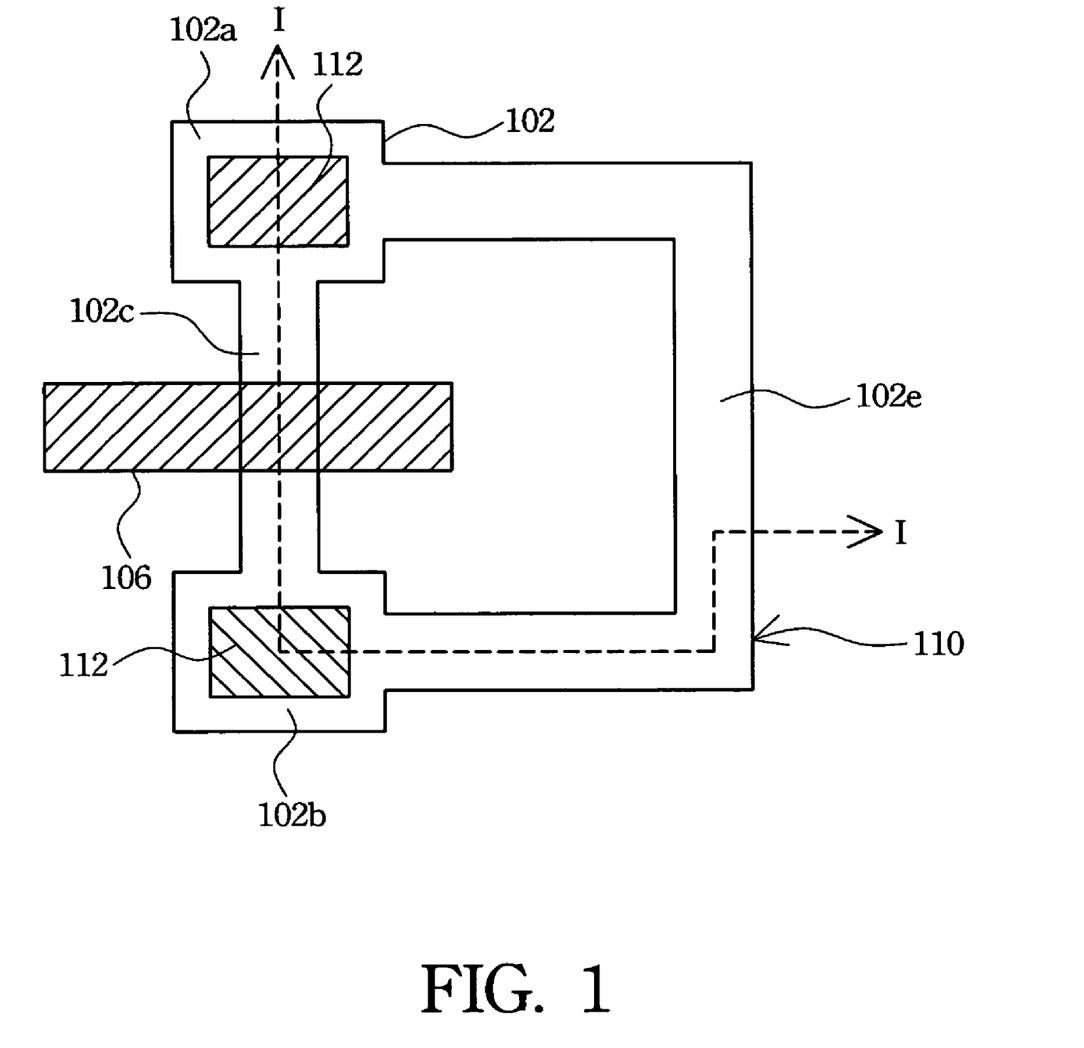
FIG. 1 is a top view of the thin film transistor in accordance with the first preferred embodiment of the present invention.
Figure 2A:
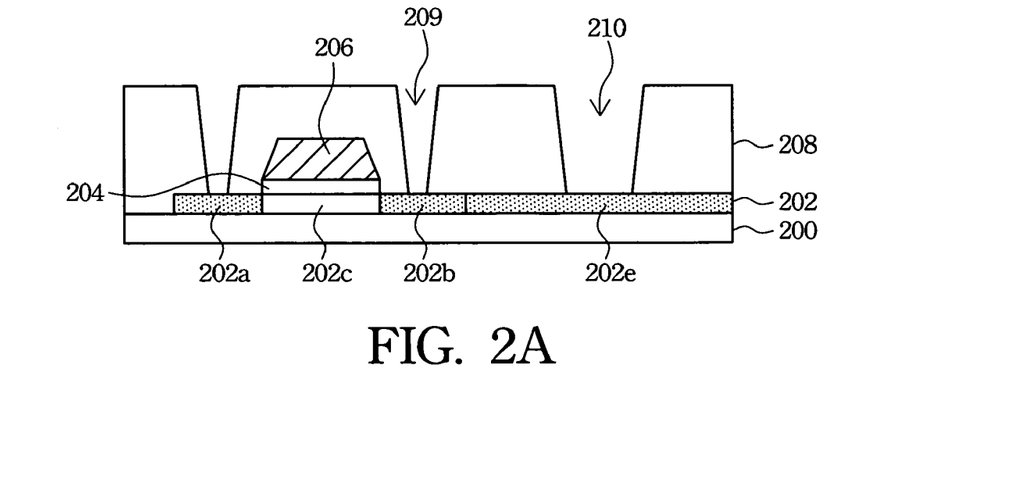
FIGS. 2A–2C are cross-sectional schematic diagrams showing the process for forming the thin film transistor in accordance with the first preferred embodiment of the present invention.
Figure 2B:
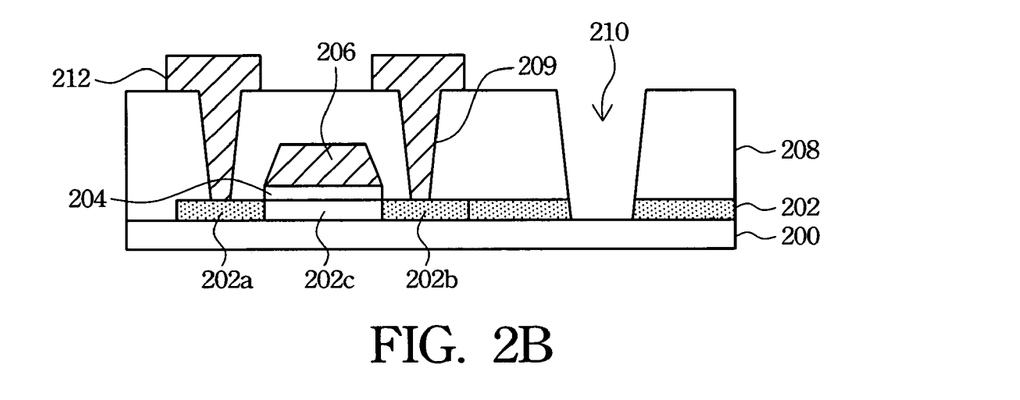
Figure 2C:
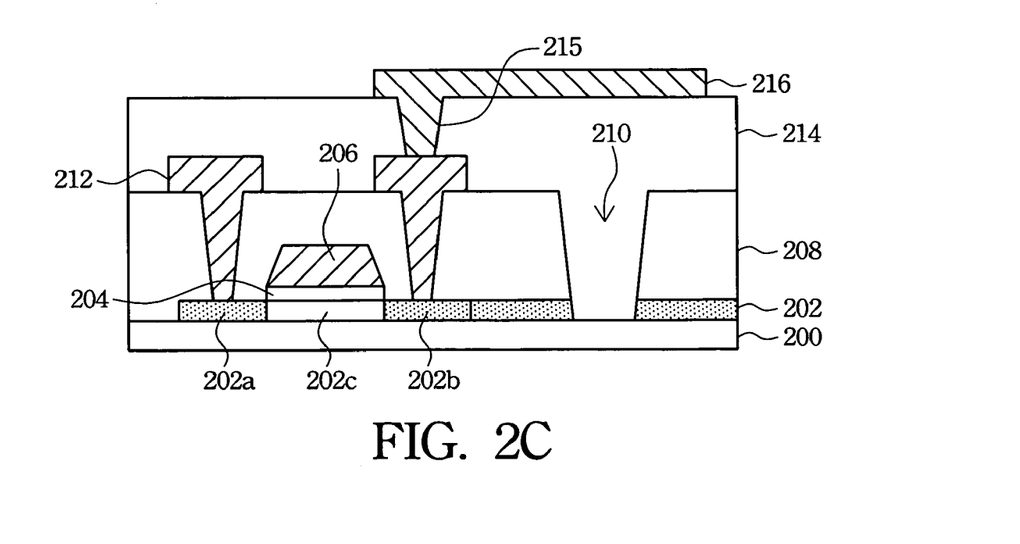

The present invention discloses a method of forming TFT devices with ESD protection and a structure thereof. Referring to FIG. 1 and FIGS. 2A–2C respectively. FIG. 1 is a top view of a TFT in accordance with the first preferred embodiment of the present invention, and FIGS. 2A–2C are cross-sectional schematic diagrams showing the process for forming the TFT in accordance with the first preferred embodiment of the present invention. The cross-sectional structure shown in FIGS. 2A–2C is taken along line I—I in FIG. 1.

A source region is connected with a drain region to form a short circuit by utilizing a pattern design for a poly-Si layer. Referring to FIG. 1, in addition to the source region 102a, the drain region 102b and a channel region 102c, a connector 102e connecting the source region 102a and the drain region 102b is also formed in the poly-Si layer 102 to construct the short circuit for dispersing static electricity accumulated in TFT fabrication. Further, a gate electrode 106 on the channel region 102c is used to control the switch of the TFT, and a source/drain (S/D) metal 112 contacting the source region 102a and the drain region 102b is located on the source region 102a and the drain region 102b of the poly-Si layer 102. The connector 102e is cut off at a position 110 in a final process of the TFT fabrication to destroy the short circuit and recover the electrical property of the TFT.

Referring to FIGS. 2A–2C showing the process for forming the TFT, as shown in FIG. 2A, a poly-Si layer 202 is formed on a substrate 200, and the poly-Si layer 202 is patterned to form an active region and a connector 202e, and a region 202a, a region 202b and the connector 202e are implanted with ions to form a source region 202a, a drain region 202b and the connector 202e with the same conductivity. Further, a region 202c between the source region 202a and the drain region 202b is a channel region 202c. The substrate 200 may be a glass substrate for display fabrication, and the poly-Si layer 202 is preferably formed by chemical vapor deposition (CVD) and excimer laser annealing (ELA), and the preferred thickness of the poly-Si layer 202 is about 50 nm.

Then, a gate-oxide layer 204 and a gate electrode 206 are formed in turn on the poly-Si layer 202. The gate electrode 206 is above the channel region 202c. The gate-oxide layer 204 may be a silicon oxide ($SiO_x$) layer, and the gate electrode 206 is a material with good electric conductivity such as moly-tungsten (MoW) or aluminum (Al). After forming the gate electrode 206, a dielectric interlayer 208 is formed and patterned to form contact holes 209 and an opening 210 exposing the poly-Si layer 202. The contact holes 209 are used to contact the source region 202a and the drain region 202b in the poly-Si layer 202, and the opening 210 is used to expose the connector 202e in the poly-Si layer 202 (i.e., the position 110 in FIG. 1). The dielectric interlayer 208 may be a $SiO_x$ layer or a silicon nitride ($SiN_x$) layer.

Next, referring to FIG. 2B, a source/drain (S/D) metal 212 is formed on the dielectric interlayer 208 and in the contact holes 209 and the opening 210, and the S/D metal 212 is also patterned to form data lines (not shown). The S/D metal 212 is a material with good electric conductivity such as MoW or Al, and the preferred thickness of the S/D metal is about 300 nm. Further, the S/D metal 212 in the opening 210 and the poly-Si layer 202 in the opening 210 are also removed to cut off the connector 202e simultaneously when the S/D metal 212 is patterned.

Etching is utilized for patterning the S/D metal 212 and the etching condition for the S/D metal 212 is controlled to have a poor etch selectivity to the poly-Si layer 202, and over-etch for the S/D metal 212 is also used to remove the poly-Si layer 202 in the opening 210. In addition, because the thickness of the poly-Si layer 202 is much smaller than that of the S/D metal 212, the poly-Si layer 202 in the opening 210 is removed when the S/D metal 212 is over-etched. The connector 202e is therefore cut off by removing the poly-Si layer 202 in the opening 210, and the TFT device is then produced. The preferred etching for the S/D metal 212 is plasma dry etching by providing gases with chlorine ionic molecules such as, for example, chlorine ($Cl_2$) or boron trichloride ($BCl_3$).

Another method for cutting the connector 202e also can be performed by utilizing another etching condition for the poly-Si layer 202. The poly-Si layer 202 in the opening 210 is removed by using another etching process for the poly-Si layer after etching the S/D metal, and the etching condition for the poly-Si layer has a good etch selectivity to the dielectric interlayer 208. The preferred etching for the poly-Si layer 202 is plasma dry etching by providing gases with fluorine ionic molecules.

Finally, subsequent processes for linking the TFT and a pixel electrode are performed and, with reference to FIG. 2C, a passivation layer 214 and the pixel electrode 216 are formed in turn. The passivation layer 214 has a via hole 215 exposing one of the S/D metal 212, and the pixel electrode 216 contacts the S/D metal 212 through the via hole 215. Therefore, a display device with the TFT deriver is produced.

For the aforementioned structural design and process for forming the TFT with ESD protection, a source region is connected electrically with a drain region to construct a short circuit, and accumulation of static electricity produced in processes of TFT fabrication is dispersed by the short circuit to prevent ESD. The short circuit is canceled by cutting the connection between the source region and the drain region in a final process of TFT fabrication, and the electrical property of the TFT is thus recovered when the TFT is accomplished. Therefore, ESD issues existing inside a single TFT are resolved by employing the present invention, and efficiency of ESD protection is also improved greatly.

Because the position being cut is defined with the process of patterning the dielectric interlayer, and cutting step is completed in the process of patterning the S/D metal, the general processes of TFT fabrication are not affected and no additional photo-masks or procedures are necessary. Therefore, a TFT with ESD protection is produced just by utilizing a partial change in pattern design.

In addition, the step for cutting a short circuit is performed before forming a passivation layer, and thus the smoothness of a passivation layer is not affected, and property or quality requirements of films later formed is also kept to maintain product quality. For example, pixel electrode quality and actual area of pixel electrodes are affected by film smoothness, and aperture ratio of display devices is thus affected.

Embodiment 2

Figure 3:
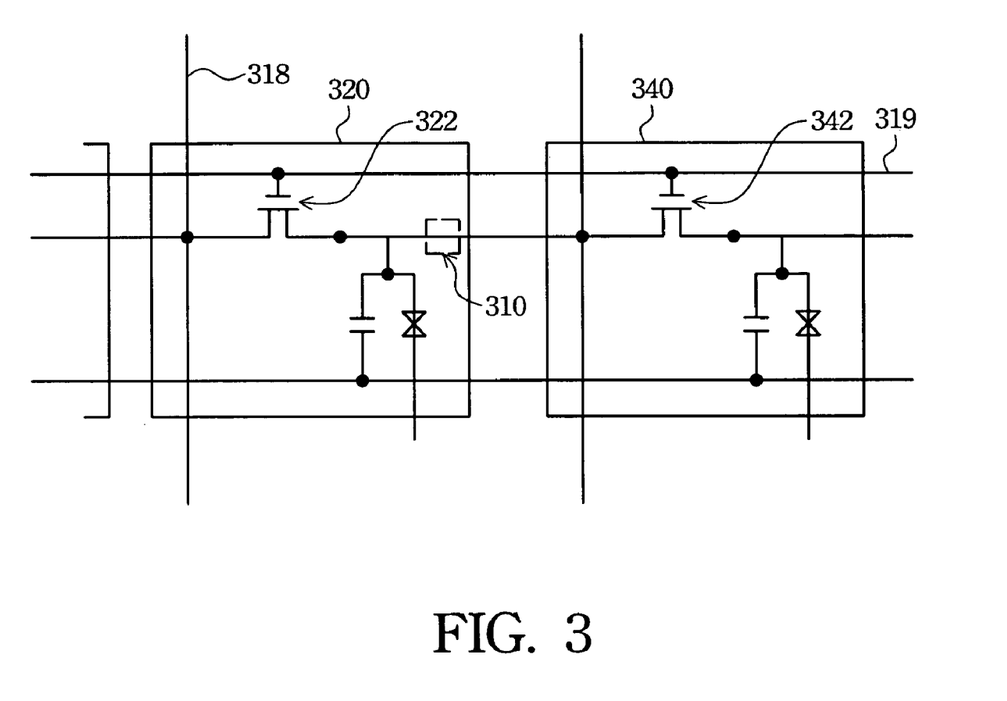
FIG. 3 is a schematic diagram showing a partial array structure of the display devices in accordance with the second preferred embodiment of the present invention.
Figure 4:
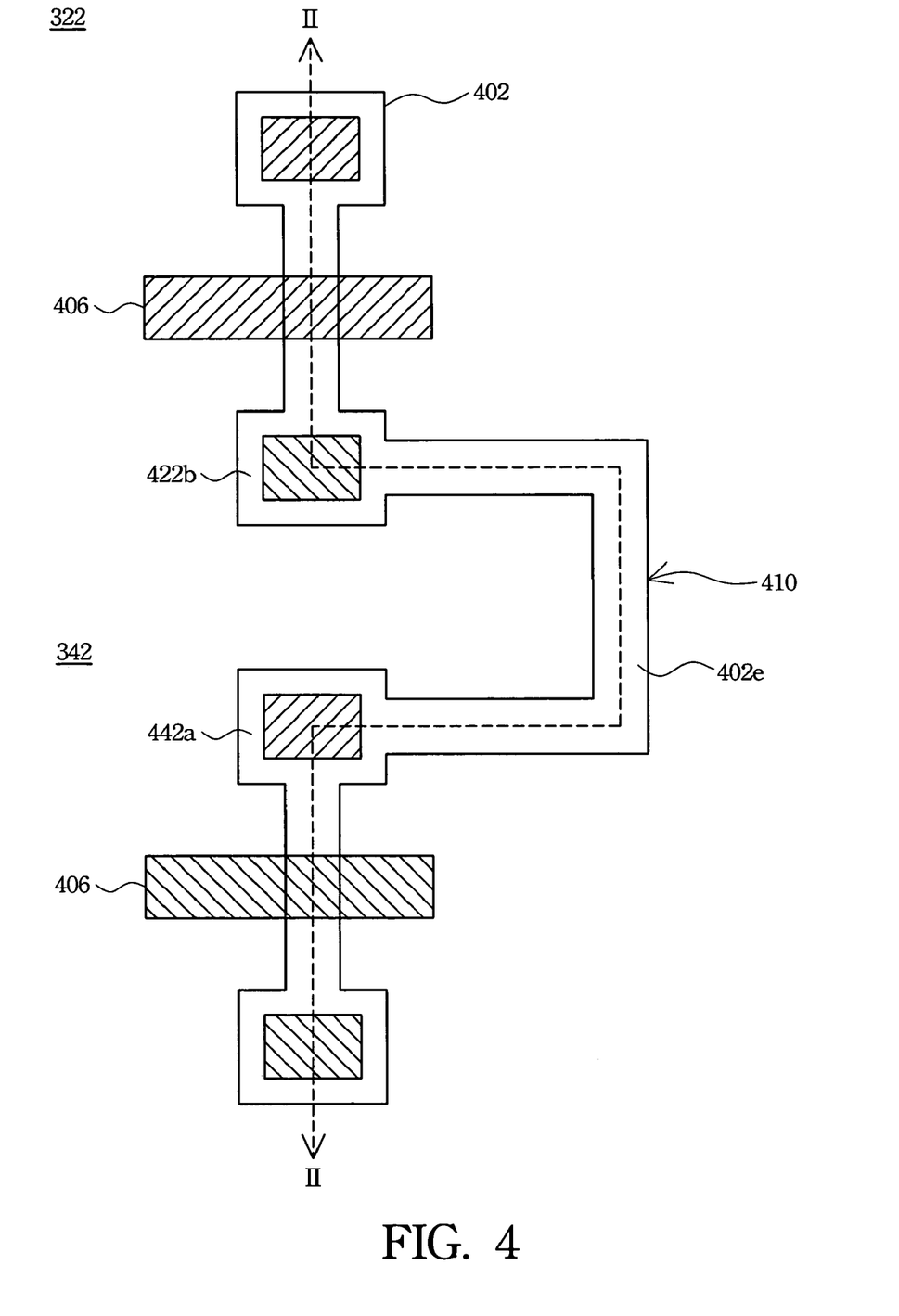
FIG. 4 is a top view of the thin film transistor devices in accordance with the second preferred embodiment of the present invention.
Figure 5A:
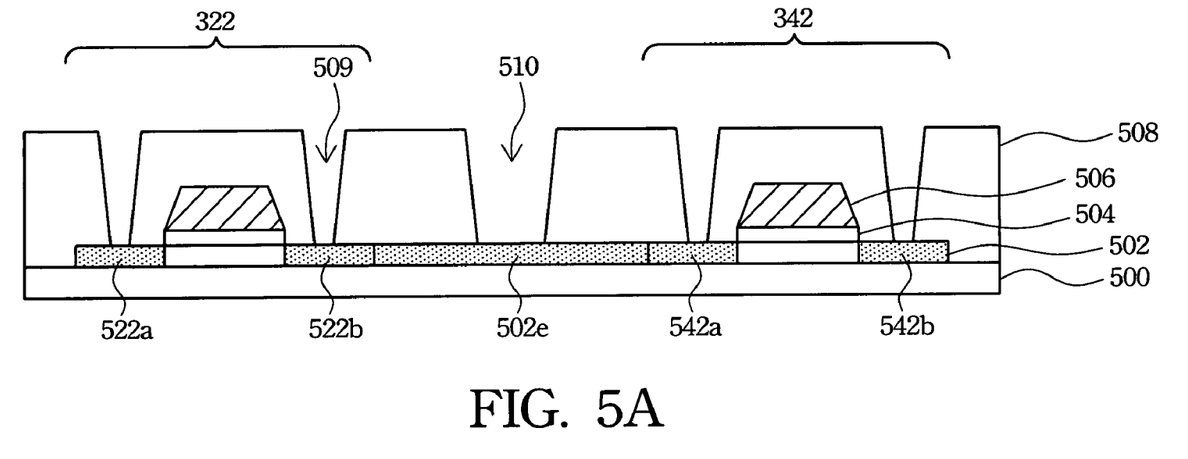
FIGS. 5A–5C are cross-sectional schematic diagrams showing the process for forming the thin film transistor devices in accordance with the second preferred embodiment of the present invention.
Figure 5B:
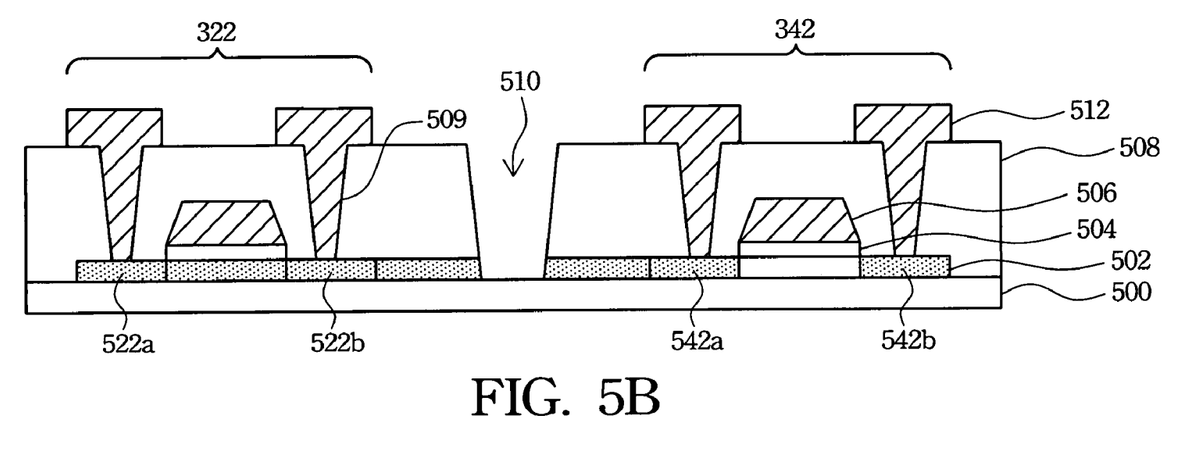
Figure 5C:
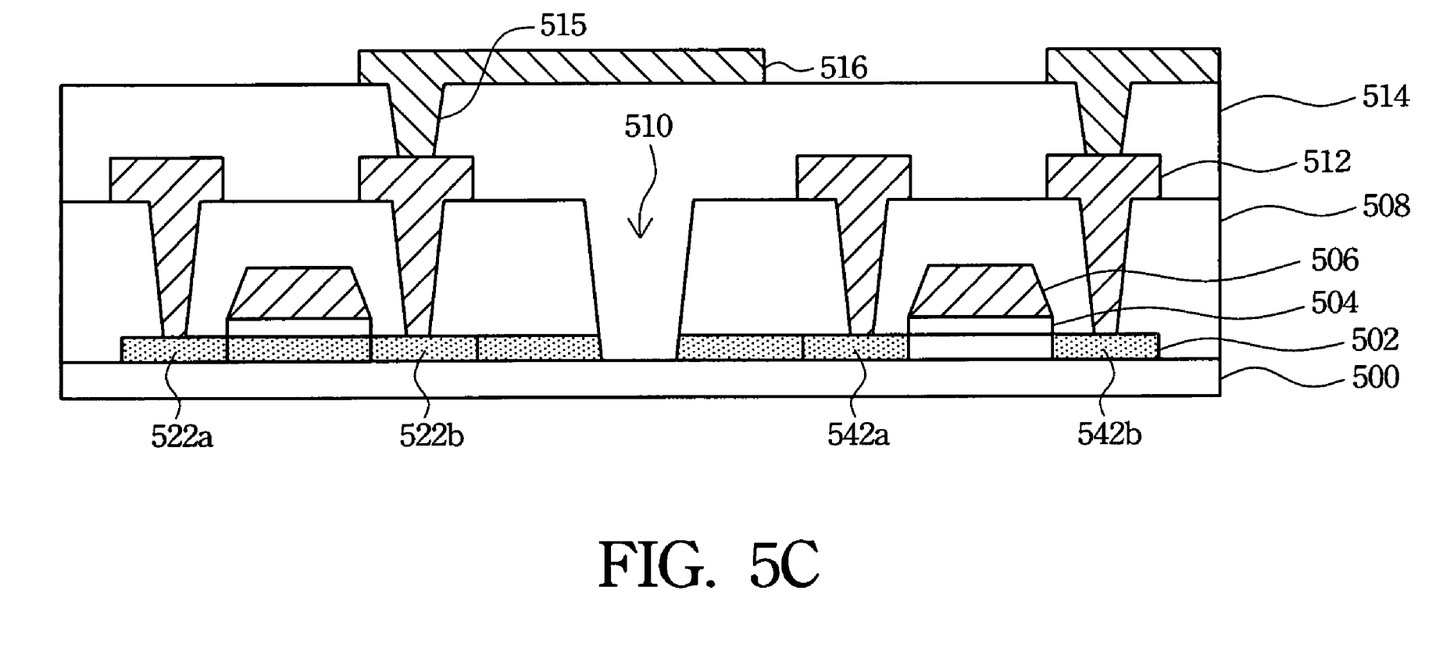

The present invention discloses another method of forming TFT devices with ESD protection and a structure thereof. Reference is made to FIG. 3, FIG. 4 and FIGS. 5A–5C respectively. FIG. 3 is a partial array structure of the display devices in accordance with the second preferred embodiment of the present invention, FIG. 4 is a top view of TFT devices in accordance with the second preferred embodiment of the present invention, and FIGS. 5A–5C are cross-sectional schematic diagrams showing the process for forming the TFT devices in accordance with the second preferred embodiment of the present invention. The cross-sectional structure shown in FIGS. 5A–5C is taken along line II—II in FIG. 4.

A TFT in a pixel is connected electrically with another TFT in another pixel by pattern design for a poly-Si layer to form a short circuit. Referring to FIG. 3, regions controlled by data lines 318 and scan lines 319 represent pixels, and a TFT 322 in a pixel 320 is connected with a TFT 342 in a pixel 340 to form a short circuit between the TFT 322 and the TFT 342, and a circuit structure with ESD protection is thus formed. Then, the connection between the TFT 322 and the TFT 342 is cut off at a position 310 in a final process of TFT fabrication.

Referring to FIG. 4 showing an actual top view of the TFT devices structure, a poly-Si layer 402 has two active regions of the TFT 322 and the TFT 342, and gate electrodes 406 are used to control the switches of the TFT 322 and the TFT 342. A drain region 422b in the TFT 322 is connected electrically with a source region 442a in the TFT 342 by a connector 402e to construct the short circuit for dispersing static electricity accumulated in TFT fabrication. The connector 402e is cut off at a position 410 in a final process of TFT fabrication to destroy the short circuit to recover the electrical property of TFT devices.

Referring to FIGS. 5A–5C showing the process for forming the TFT devices, a poly-Si layer 502 is formed on a substrate 500, and the poly-Si layer 502 is patterned to form regions for the TFT 322 and the TFT 342 and a connector 502e for linking the TFT 322 and the TFT 342, but an individual active region for the TFT 322 or the TFT 342 is not defined yet. Then, a source region 522a, a source region 542a, a drain region 522b, a drain region 542b and the connector 502e are all implanted with ions so as to have the same conductivity, and the drain region 522b is connected electrically with the source region 542a. The substrate 500 may be a glass substrate for display fabrication, and the preferred thickness of the poly-Si layer 502 is about 50 nm.

Then, a gate-oxide layer 504 and gate electrodes 506 are formed in turn. The gate-oxide layer 504 may be a $SiO_x$ layer, and the material of the gate electrodes 506 is a metal with good electric conductivity such as MoW or Al. After forming the gate electrodes 506, a dielectric interlayer 508 is formed and patterned to form contact holes 509 and an opening 510 exposing the poly-Si layer 502. The opening 510 is used to expose the connector 502e in the poly-Si layer 502 (i.e., the position 410 in FIG. 4). The dielectric interlayer 508 may be a $SiO_x$ layer or a $SiN_x$ layer.

Next, referring to FIG. 5B, a S/D metal 512 is formed on the dielectric interlayer 508 and in the contact holes 509 and the opening 510, and the S/D metal 512 is also patterned to form data lines (not shown). The S/D metal 512 is a material with good electric conductivity such as MoW or Al, and the preferred thickness of the S/D metal is about 300 nm. Further, as in the first embodiment, the S/D metal 512 in the opening 510 and the poly-Si layer 502 in the opening 510 are also removed to cut off the connector 502e simultaneously with patterning of the S/D metal 512.

Etching for patterning the S/D metal 512 is controlled to have a poor etch selectivity to the poly-Si layer 502, and over-etch for the S/D metal 512 is also used to remove the poly-Si layer 502 in the opening 510 when the S/D metal 512 is patterned. The connector 502e connecting the TFT 322 and the TFT 342 is therefore cut off by removing the poly-Si layer 502 in the opening 510 to cancel the short circuit between the TFT 322 and the TFT 342, and the individual active region for the TFT 322 and the TFT 324 is then formed, and the TFT devices are produced.

Finally, subsequent processes for linking the TFT devices and pixel electrodes are performed and, with reference to FIG. 5C, a passivation layer 514 and the pixel electrodes 516 are formed in turn. The passivation layer 514 has via holes 515 exposing one of the S/D metal 512, and the pixel electrodes 516 contact the S/D metal 512 through the via holes 515. Therefore, a display device with the TFT drivers is produced.

For the aforementioned structural design and process for forming the TFT with ESD protection, neighbor TFT units are connected electrically to construct a short circuit, and accumulation of static electricity produced in processes of TFT fabrication is dispersed by the short circuit to prevent ESD. The short circuit is canceled by cutting the connection between the neighbor TFT units in a final process of TFT fabrication, and the electrical property of the TFT devices is thus recovered when the TFT devices are accomplished. Therefore, ESD issues existing inside TFT devices are resolved by employing the present invention, and efficiency of ESD protection is also improved greatly. In addition, the step for cutting the short circuit is performed before forming a passivation layer, and thus the smoothness of a passivation layer later formed is not affected, and property or quality requirements for pixel electrode fabrication is also kept to maintain product quality.

Embodiment 3

Because ESD protection is achieved by the first embodiment or the second embodiment for forming TFT devices, the present invention discloses further a method of forming TFT devices with ESD protection by combining the first embodiment and the second embodiment for optimized ESD protection.

Figure 6:
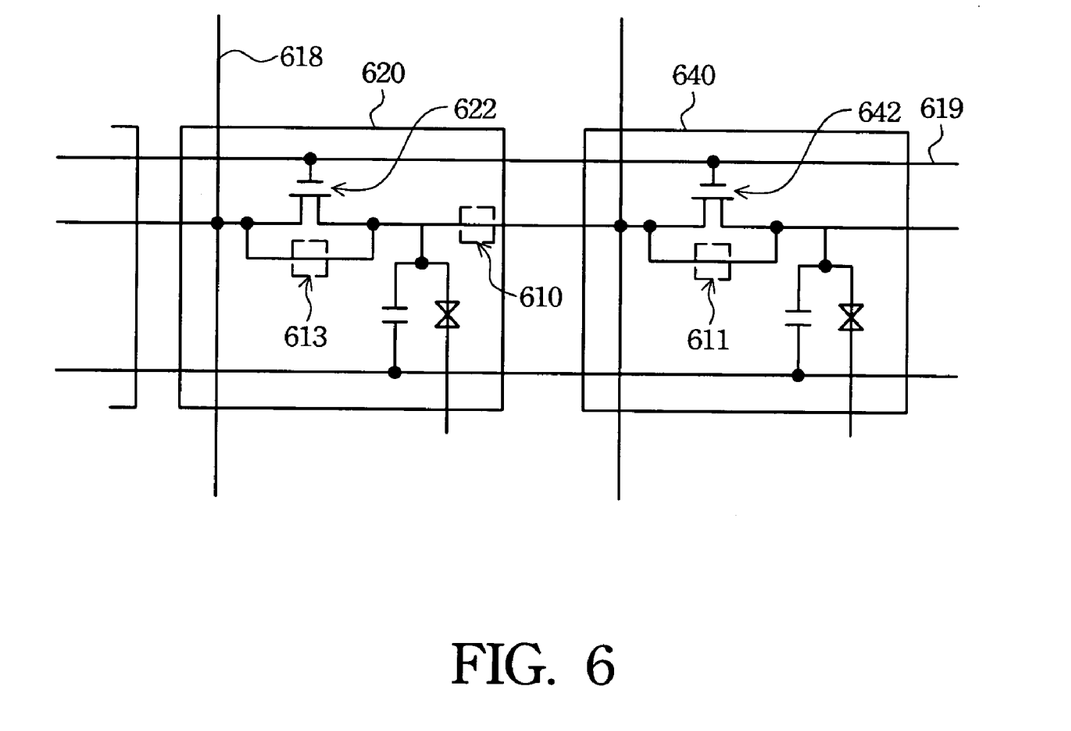
FIG. 6 is a schematic diagram showing a partial array structure of the display devices in accordance with the third preferred embodiment of the present invention.
Figure 7:
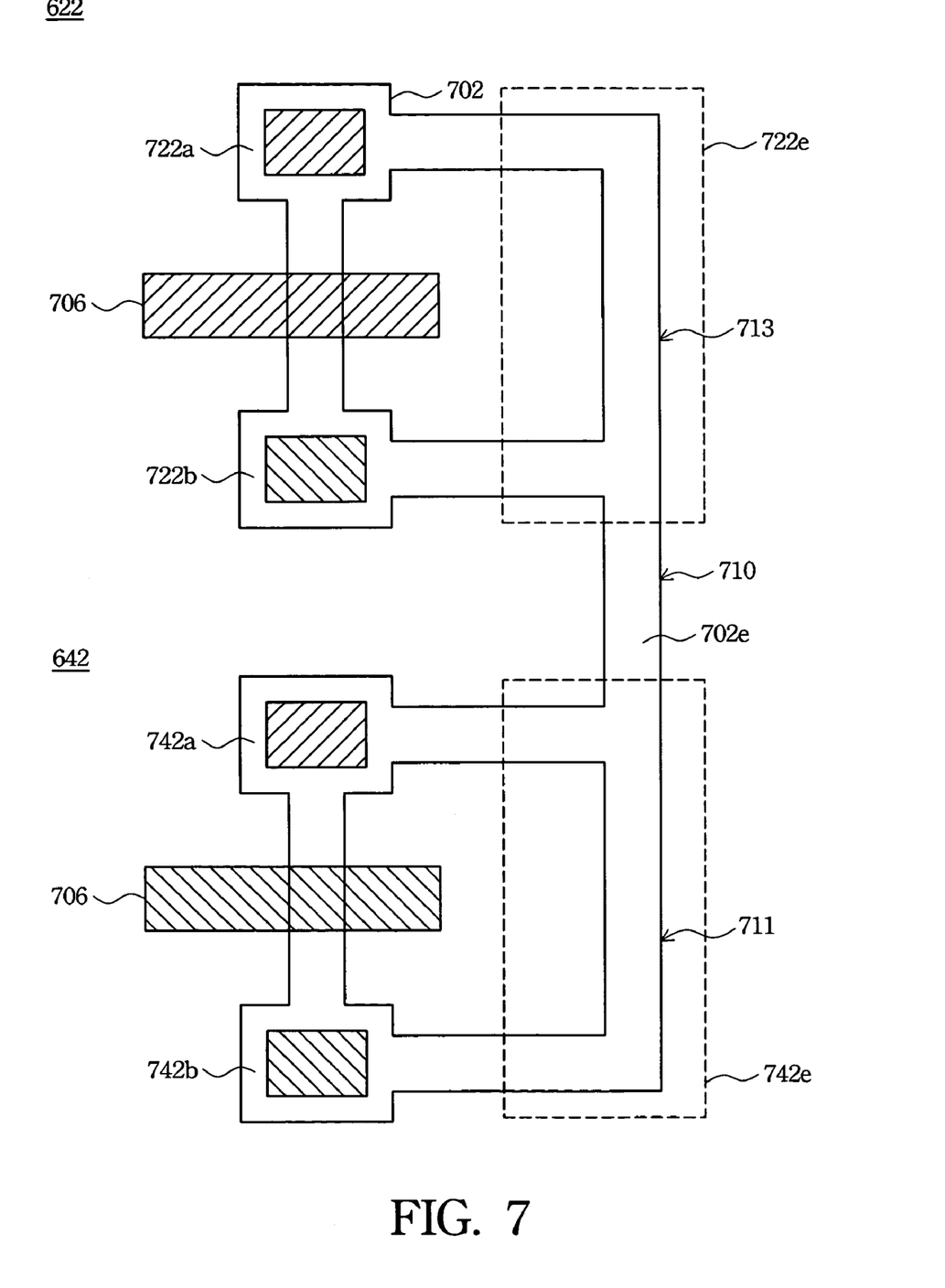
FIG. 7 is a top view of the thin film transistor devices in accordance with the third preferred embodiment of the present invention.

Reference is made to FIG. 6 and FIG. 7, respectively. FIG. 6 is a partial array structure of the display devices in accordance with the third preferred embodiment of the present invention, and FIG. 7 is a top view of TFT devices in accordance with the third preferred embodiment of the present invention.

A source region is connected electrically with a drain region in each TFT to form short circuits, and a TFT in a pixel is also connected electrically with another TFT in another pixel to form another short circuit. Referring to FIG. 6, regions controlled by data lines 618 and scan lines 619 represent pixels, and a TFT 622 in a pixel 620 is connected electrically with a TFT 642 in a pixel 640 to form a short circuit between the TFT 622 and the TFT 642. Further, a source region is also connected electrically with a drain region in the TFT 622 to form another short circuit, and the same short circuit design is inside the TFT 642. Therefore, a circuit design for dispersing static electricity accumulation more completely is obtained. Then, the short circuits are cut off at a position 610, a position 611 and a position 613 in a final process of TFT fabrication to recover the electrical property of the TFT devices.

Referring to FIG. 7, showing an actual top view of the TFT devices structure, a poly-Si layer 702 has two active regions of the TFT 622 and the TFT 642, and gate electrodes 706 are used to control each switch of the TFT 722 and the TFT 742. A drain region 722b in the TFT 622 is connected electrically with a source region 742a in the TFT 642 by a connector 702e to construct the short circuit between the TFT 622 and the TFT 642. Further, a source region 722a is connected electrically with the drain region 722b by a connector 722e in the TFT 622, the source region 742a is also connected electrically with a drain region 742b by another connector 742e in the TFT 642, and short circuits are thus constructed inside the TFT 622 and the TFT 642, respectively.

Therefore, static electricity accumulation produced in TFT fabrication is dispersed by the connector 702e, the connector 722e and the connector 742e at the same time. The ways for dispersing static electricity accumulation are increased to reduce more effectively the ESD effect and probability of ESD, and ESD protection is greatly improved. The connector 702e, the connector 722e and the connector 742e are all cut off at a position 710, a position 711 and a position 713, respectively, in a final process of TFT fabrication to destroy the short circuits, and the electrical property of TFT devices is thus recovered finally.

The process for forming TFT devices of the third embodiment is similar to that of the first embodiment or the second embodiment, a poly-Si layer is formed firstly, and the poly-Si layer is patterned and implanted with ions to define TFT unit regions, source regions, drain regions and connectors. Then, general subsequent procedures of TFT fabrication are performed, and the step for cutting the connectors is completed by employing the S/D metal etching process when data lines are defined. Finally, processes for linking the TFT devices and pixel electrodes are performed.

According to the aforementioned preferred embodiments of the present invention, with the application of the present invention, a poly-Si TFT device with good ESD protection is obtained and product yield and reliability of display devices are therefore improved. The general processes of TFT fabrication are not affected, there is no need for additional photo-masks or procedures, and a TFT device with ESD protection is formed just by utilizing a partial change in pattern design.

In addition, short circuits are cut off before forming a passivation layer; the smoothness of a passivation layer and pixel electrode fabrication conditions are thus not affected, and property or product quality of display devices, such as aperture ratio, is also maintained.

The present invention is not limited to use in poly-Si TFT fabrication for liquid crystal flat panel display; other TFT devices also can be fabricated by using the present invention to improve product quality and product yield. While the present invention has been disclosed with reference to the preferred embodiments of the present invention, it should not be considered as limited thereby. Various possible modifications and alterations by one skilled in the art can be included within the spirit and scope of the present invention, the scope of the invention is determined by the claims that follow.

What is claimed is:

1. A method of forming thin-film transistor devices with electro-static discharge protection, comprising the steps of:
   forming a silicon layer on a substrate;
   forming a plurality of source regions, a plurality of drain regions and a plurality of connectors in the silicon layer, wherein the source regions are connected electrically with the drain regions by the connectors;
   forming a gate oxide layer on the silicon layer;
   forming a plurality of gate electrodes on the gate-oxide layer;
   forming a dielectric interlayer;
   patterning the dielectric interlayer to form a plurality of contact holes and a plurality of openings, wherein the contact holes expose each of the source regions and each of the drain regions in the silicon layer, and the openings expose each of the connectors in the silicon layer;
   forming a source/drain metal layer on the dielectric interlayer and in the contact holes and the openings; and
   patterning the source/drain metal layer to form a plurality of data lines and remove entirely the silicon layer in the openings to cut the connectors.

2. The method of claim 1, wherein the silicon layer is a polycrystalline silicon (poly-Si) layer.

3. The method of claim 1, wherein the silicon layer further comprises a plurality of channel regions between the source regions and the drain regions.

4. The method of claim 1, wherein the step of forming the source regions, the drain regions and the connectors comprises ion-implantation.

5. The method of claim 1, wherein the source regions, the drain regions and the connectors have identical conductivities and are connected to form short circuits.

6. The method of claim 1, wherein each of the source regions is connected electrically with each of the drain regions by each of the connectors.

7. The method of claim 1, wherein the step of patterning the source/drain metal layer comprises plasma dry etching.

8. The method of claim 7, wherein the plasma dry etching further comprises a single-step process or a two-step process.

9. The method of claim 8, wherein the single-step process is etching by providing gases with chlorine ionic molecules.

10. The method of claim 8, wherein the two-step process comprises a first step of etching the source/drain metal layer and a second step of etching the silicon layer in the openings.

11. The method of claim 10, wherein the first step of etching the source/drain metal layer is etching by providing gases with chlorine ionic molecules.

12. The method of claim 10, wherein the second step of etching the silicon layer in the openings is etching by providing gases with fluorine ionic molecules.

13. The method of claim 1, further comprising the steps of:
   forming a passivation layer;
   patterning the passivation layer to form a plurality of via holes exposing the source/drain metal layer; and
   forming a plurality of pixel electrodes and a plurality of pixel lines simultaneously, wherein the pixel electrodes are in the via holes to contact the source/drain metal layer.

* * * * *